(12) United States Patent
Kamase

(10) Patent No.: US 6,219,536 B1
(45) Date of Patent: Apr. 17, 2001

(54) MIXER CIRCUIT

(75) Inventor: Fumihiro Kamase, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/154,981

(22) Filed: Sep. 17, 1998

(30) Foreign Application Priority Data

Sep. 19, 1997 (JP) .................................................... 9-255004

(51) Int. Cl.[7] .............................. H04B 1/28; H04B 1/26; H03B 19/00; G06F 7/44; G06G 7/16
(52) U.S. Cl. .......................... 455/333; 455/118; 455/323; 327/113; 327/356
(58) Field of Search ..................................... 455/333, 118, 455/323; 327/113, 356

(56) References Cited

U.S. PATENT DOCUMENTS 4,327,445 * 4/1982 Tanaka ................................... 455/118
5,396,132 * 3/1995 Shiga ..................................... 327/113

FOREIGN PATENT DOCUMENTS

| | | |
|---|---|---|
| 59-207709 | 11/1984 | (JP) . |
| 59-207710 | 11/1984 | (JP) . |
| 7-135427 | 5/1995 | (JP) . |
| 8-154019 | 6/1996 | (JP) . |

* cited by examiner

*Primary Examiner*—Nay Maung
*Assistant Examiner*—Raymond Persino
(74) *Attorney, Agent, or Firm*—Sughrue, Mion, Zinn, Macpeak & Seas, PLLC

(57) ABSTRACT

To provide an analog mixer circuit operating with low power consumption and without needing any BEF for isolating two input signals, an LO signal and an IF signal are supplied to bases of a first transistor (Q1) and a second transistor (Q2) serially connected. A signal of a node (17) where the emitter of the first transistor (Q1) and the collector of the second transistor (Q2) is amplified nonlinearly by a third transistor (Q3) to be output to an output terminal (11), wherefrom an RF signal is extracted by a HPF (18).

4 Claims, 6 Drawing Sheets

MIXER CIRCUIT

BACKGROUND OF THE INVENTION

The present invention relates to an analog mixer circuit for down-converting an RF (Radio Frequency) signal into an IF (Intermediate Frequency) signal or up-converting an IF signal into an RF signal, by mixing an LO (LOcal frequency) signal.

FIG. 4 is a circuit diagram illustrating a conventional mixer circuit. A mixer IC 73 comprises a transistor 50, whereof a collector is coupled to an output terminal 55, a base is coupled to an input terminal 54 and an emitter is coupled to a ground terminal 57. The collector is connected to a power supply terminal 56 through a resistor 51. The base of the transistor 50 is connected to the ground terminal 57 through a resistor 53 and connected to the collector through a resistor 52.

Between the power supply terminal 56 and the ground terminal 57, a power supply voltage Vcc is supplied. The input terminal 54 is connected to an end of a capacitor 61. To the other end of the capacitor 61, an LO signal, which is input to an LO terminal 68, and an IF signal, which is input to an IF terminal 69, are connected through a BEF (Band Elimination Filter) 71 and a BEF 72, respectively. The output terminal 55 is connected to an RF terminal 70 through a capacitor 62 and a HPF (High Pass Filter) 67.

The BEF 71 comprises two capacitors 58 and 59 serially connected between the LO terminal 68 and the capacitor 61, and an inductance 63 grounding a connecting point of the two capacitors 58 and 59. The BEF 72 comprises two inductances 64 and 65 serially connected between the IF terminal 69 and the capacitor 61, and a capacitor 60 grounding a connecting point of the two inductances 64 and 65.

The BEFs 71 and 72 are provided for isolating the LO signal and the IF signal to be supplied to the capacitor 61 from each other, and the circuit constants thereof are so determined that the BEF 71 shows sufficiently high impedance to the IF signal and the BEF 72 shows sufficiently high impedance to the LO signal. Therefore, the LO signal and the IF signal are added to the input terminal 54 of the mixer IC 73 without interfering with each other. The added signal is amplified nonlinearly by the transistor 50 and output to the output terminal 55, wherefrom a high-frequency component is extracted by the HPF 67 to be output through the RF terminal 70.

However, for isolating the LO and the IF signal from each other, the conventional mixer circuit of FIG. 1 necessitates the BEFs 71 and 72, which are inconvenient to be configured on an IC (Integrated Circuit) chip, taking large circuit spaces.

For dealing with this problem, there is disclosed a prior art in a Japanese patent application laid open as a Provisional Publication No. 154019/'96.

FIG. 5 is a circuit diagram illustrating a mixer circuit of this prior art.

In the mixer circuit of FIG. 5, a mixer IC 98 comprises transistors 74, 75 and 76, bias circuits 80 and 81, resistors 77 and 78 and a capacitor 84.

The base of the transistor 74 connected to an LO input terminal 87 of the mixer IC 98 is biased by the bias circuit 80 connected between a power supply terminal 89 and a ground terminal 90, and the base of the transistor 75 connected to an IF input terminal 88 of the mixer IC 98 is biased by the bias circuit 81 also connected between the power supply terminal 89 and the ground terminal 90.

The emitters of the transistors 74 and 75 are connected to the ground terminal 90. The collectors of the transistors 74 and 75 are coupled and connected to the power supply terminal 89 through the resistor 77.

The base of the transistor 76 is connected to the collectors of the transistors 74 and 75. The resistor 78 and the capacitor 84 are connected in parallel between the emitter of the transistor 76 and the ground terminal 90. The collector of the transistor 76 is connected to an output terminal 91 of the mixer IC 98.

An LO signal supplied to an LO terminal 95 is input to the LO input terminal 87 through a capacitor 82, and an IF signal supplied to an IF terminal 96 is input to the IF input terminal 88 through a capacitor 83. A power supply voltage Vcc is supplied between the power supply terminal 89 and the ground terminal 90. Tile output terminal 91 is connected to an end of a HPF 94. The other end of the HPF 94 is connected to an RF terminal 97 through a capacitor 86 and to the power supply terminal 89 through a resistor 79.

In the mixer circuit of FIG. 5, the LO signal input to the LO input terminal 87 of the mixer IC 98 and the IF signal input to the IF input terminal 88 are isolated from each other by the transistors 74 and 75, and mixed signal thereof obtained at coupled collectors of the transistors 74 and 75 is amplified nonlinearly by the transistor 76. The RF signal is extracted by the HPF 94 to be output through the RF terminal 97.

Thus, a mixer circuit is realized in the prior art of FIG. 5 without needing any BEF for isolating input LO and IF signals from each other.

However, the mixer circuit of FIG. 5 necessitates two input transistors 74 and 75 driven in parallel. Hence, power consumption of the mixer circuit of FIG. 5 becomes considerably high.

SUMMARY OF THE INVENTION

Therefore, a primary object of the present invention is to provide an analog mixer circuit which does not need any BEF for isolating two input signals, and can operate at the same time with lower power consumption than the prior art of FIG. 5.

In order to achieve the object, a mixer circuit of the invention comprises:

a first transistor, a collector thereof being connected to a power supply terminal, an emitter thereof connected to a node and a base thereof connected to a first input terminal;

a second transistor, a base thereof being connected to a second input terminal, an emitter thereof connected to a ground terminal and a collector thereof connected to the node;

a first bias circuit for biasing base potential of the first transistor;

a second bias circuit for biasing base potential of the second transistor;

a third transistor, a base thereof being connected to the node and a collector thereof connected to an output terminal;

a first resistor connected between the collector of the third transistor and the power supply terminal, and;

a parallel connection of a second resistor and a capacitor connected between an emitter of the third transistor and the ground terminal.

When the mixer circuit is used as all up-converter, an LO signal is supplied to the first input terminal through a capacitor and an IF signal is supplied to the second input terminal through another capacitor, for obtaining an RF signal through a HPF from the output terminal.

The IF signal supplied to the base of the second transistor is little affected by the potential of the node. The LO signal supplied to the base of the first transistor is a little affected by the potential of the node. However, the amplitude of the IF signal is sufficient to be comparatively low. Therefore, a sufficient isolation of the IF signal and the LO signal from each other is obtained without needing any BEF, enabling to economizing the circuit size.

Further, the isolation of the two input signals is realized with a serial connection of the first and the second transistor. Therefore, the current consumption can be reduced than the mixer circuit of the prior art wherein a parallel connection of two transistors is used for isolating two input signals.

The mixer circuit may comprise:
- a first FET (Field Effect Transistor), whereof a drain is connected to a power supply terminal, a source is connected to an mixed signal output terminal and a gate connected to a first input terminal;
- a bias circuit for biasing the gate of the first FET;
- a second FET, whereof a drain connected to the mixed signal output terminal and a gate connected to a second input terminal;
- a parallel connection of a first resistor and a first capacitor connected between a source of the second FET and a ground terminal;
- a second resistor connected between the gate of the second FET 24 and the ground terminal;
- a third FET, whereof a drain is connected to an output terminal and a gate is connected to an mixed signal input terminal which is coupled to the mixed signal output terminal through a third capacitor;
- a third resistor connected between the drain of the third FET and the power supply terminal,
- a parallel connection of a fourth resistor and a second capacitor connected between a source of the third FET and the ground terminal, and
- a fifth resistor connected between the gate of the third FET and the ground terminal.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
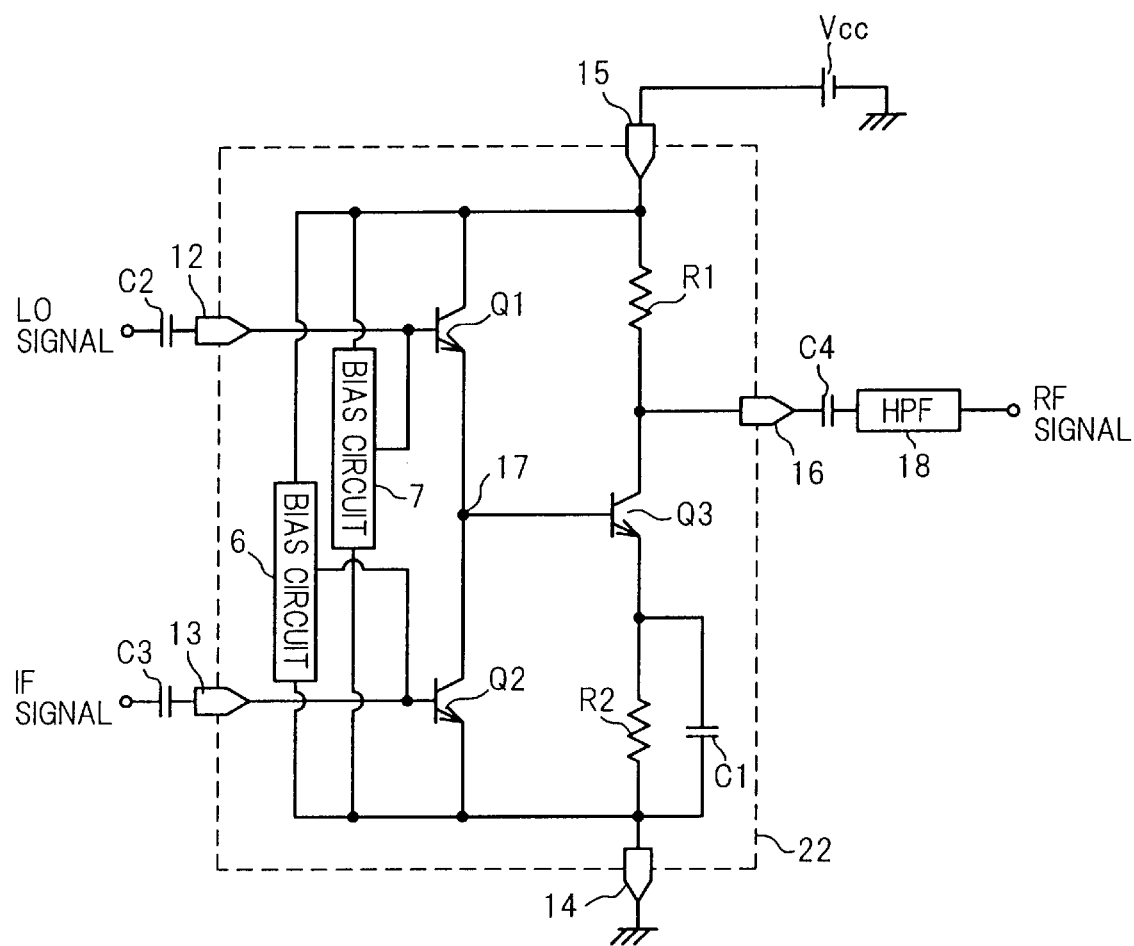
FIG. 1 is a circuit diagram illustrating a mixer circuit according to a first embodiment of the invention.

FIG. 1 is a circuit diagram illustrating a mixer circuit according to a first embodiment of the invention.

Referring to FIG. 1, the mixer circuit has a mixer IC 22 comprising
- a first transistor Q1, a collector thereof being connected to a power supply terminal 15, an emitter thereof connected to a node 17 and a base thereof connected to a first input terminal 12,
- a second transistor Q2, a base thereof being connected to a second input terminal 13, an emitter thereof connected to a ground terminal 14 and a collector thereof connected to the node 17,
- a first bias circuit 7 connected between the power supply terminal 15 and the ground terminal 14 for biasing base potential of the first transistor Q1,
- a second bias circuit 6 connected between the power supply terminal 15 and the ground terminal 14 for biasing base potential of the second transistor Q2, a third transistor Q3, a base thereof being connected to the node 17 and a collector thereof connected to an output terminal 16,
- a first resistor R1 connected between the collector of the third transistor Q3 and the power supply terminal 15, and
- a parallel connection of a second resistor R2 and a capacitor C1 connected between an emitter of the third transistor Q3 and the ground terminal 14.

Now, operation of the mixer IC 22 of FIG. 1 is described.

A power supply voltage Vcc is supplied between the power supply terminal 15 and the ground terminal 14 of the mixer IC 22. To the first and the second input terminal 12 and 13, an LO signal and an IF signal are supplied through capacitors C2 and C3, respectively. The LO signal input to the first input terminal 12 is biased by the first bias circuit 7 and supplied to the base of the first transistor Q1, and the IF signal input to the second input terminal 13 is biased by the second bias circuit 6 and supplied to the base of the second transistor Q2. Hence, potential of the node 17 represents a linear summation of the LO signal and the IF signal.

The base current of the second transistor Q2 is little affected with the collector-base voltage of the second transistor Q2, that is, with the potential variation of the node 17. Therefore, the IF signal input to the second input terminal 13 is sufficiently isolated from the LO signal input to the first terminal 12. The base current of the first transistor Q2 is a little affected with the base-emitter voltage of the first transistor Q1, that is, with the potential variation of the node 17. However, input level of the IF signal can be restricted to be sufficiently small. Therefore, leak of the IF signal to the first input terminal 12 can be controlled to be negligible, as described afterwards.

The potential of the node 17, representing the linear summation of the LO and the IF signal is supplied to the base of the third transistor Q3 and nonlinearly amplified to be output to the output terminal 16 wherefrom an RF signal is extracted by a HPF 18 through a capacitor C4.

Heretofore, operation of the mixer IC 22 used as all up-converter for converting an IF signal to an RF signal is described. However, the mixer IC 22 can be used as a down-converter as well, for converting an RF signal supplied to the second input terminal 12 into an IF signal to be output extracted by the HPF 18 from the output terminal 16.

Figure 2:
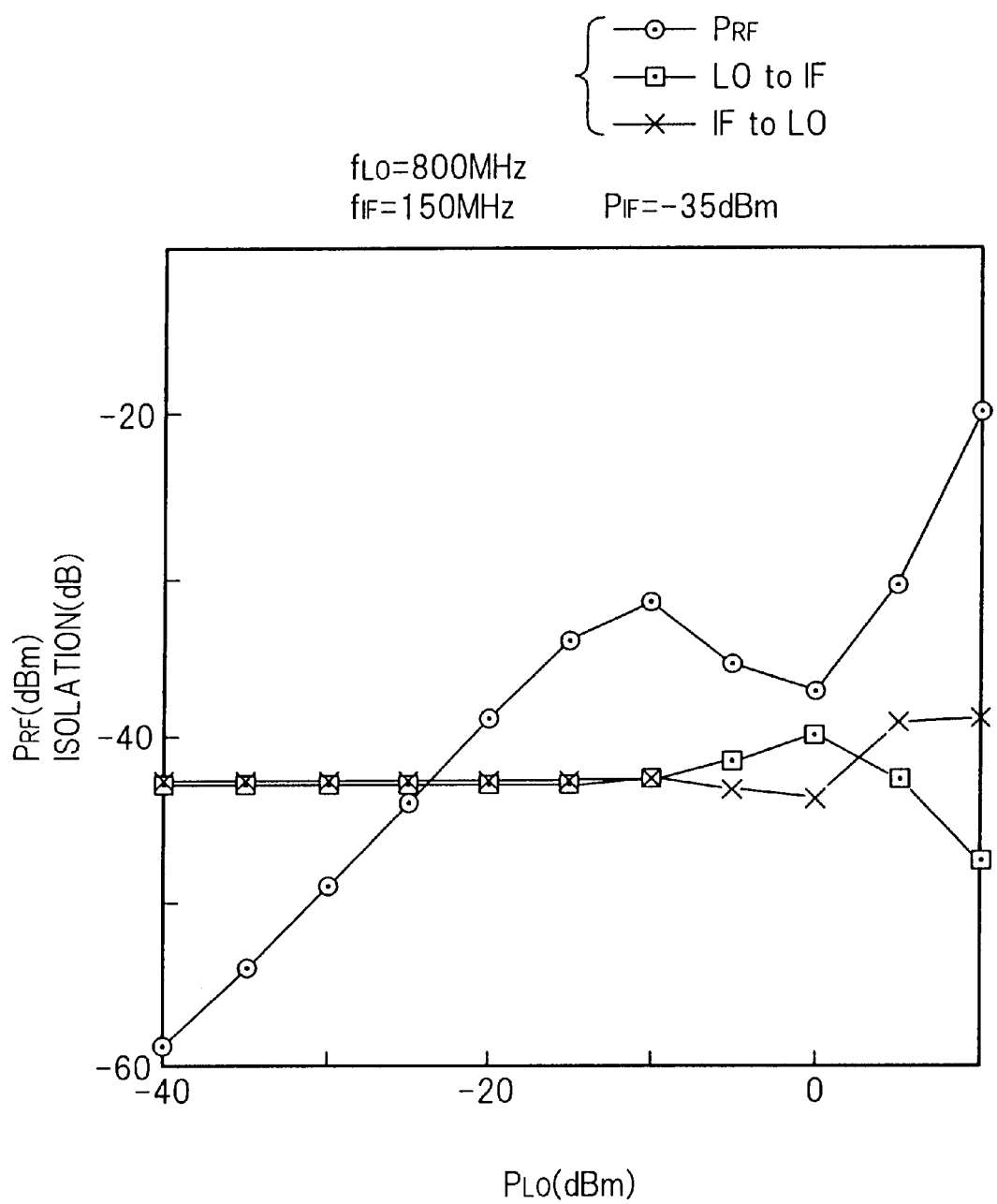
FIG. 2 is a graphic chart illustrating an in-out characteristic and isolation characteristics measured for the mixer circuit of FIG. 1.
Figure 4:
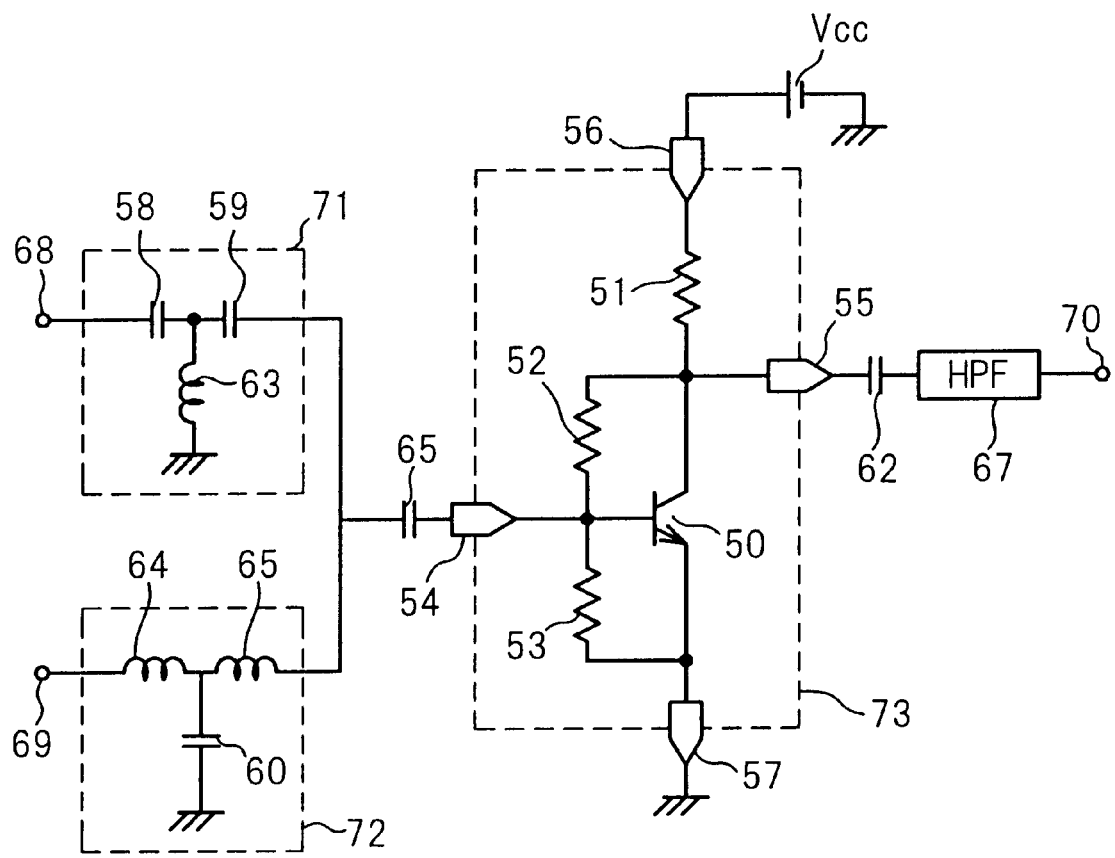
FIG. 4 is a circuit diagram illustrating a conventional mixer circuit.
Figure 6:
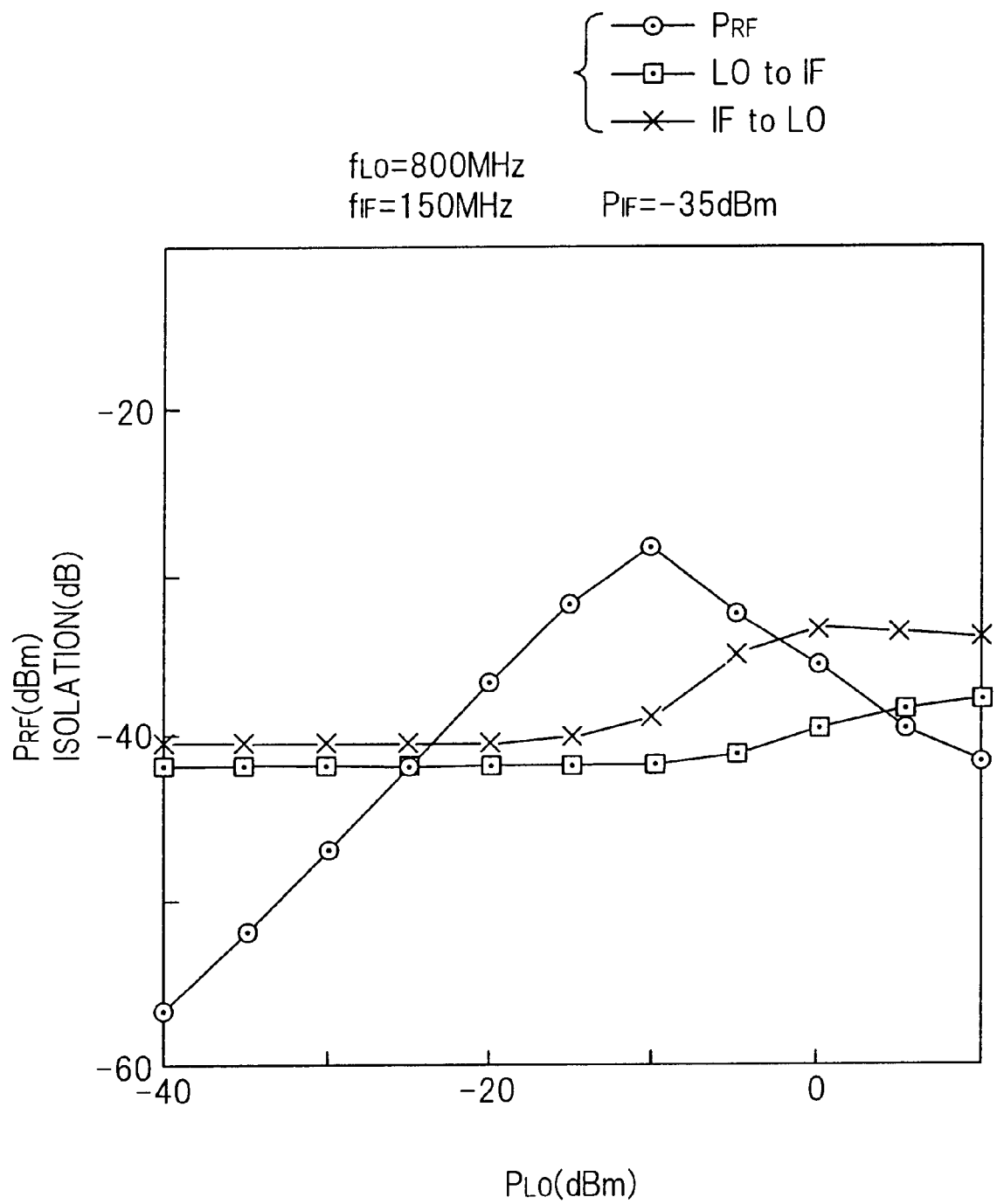
FIG. 6 is a graphic chart illustrating an in-out characteristic and isolation characteristics measured for the conventional mixer circuit of FIG. 4.

FIG. 2 is a graphic chart illustrating an in-out characteristic and isolation characteristics measured for the mixer circuit of FIG. 1, and FIG. 6 is a graphic chart illustrating the same measured for the conventional mixer circuit of FIG. 4, wherein circuit constants are so arranged that the two mixer circuits used as up-converters show substantially the same power consumption.

In each of FIGS. 2 and 6, the output power $P_{RF}$ (dBm) of the RF signal, the isolation (dB) of the LO signal to the IF signal (LO/IF) and the isolation (dB) of the IF signal to the LO signal (IF/LO) are represented when the input power $P_{LO}$ of the LO signal is changed from −40 dBm to 10 dBm, on condition that the frequencies $f_{LO}$ and $f_{IF}$ of the LO and IF signal are 800 MHz and 150 MHz, respectively, and the input power $P_{IF}$ of the IF signal is fixed at −35 dBm.

As can be understood from FIGS. 2 and 6, substantially the same output power of the RF signal and sufficient isolation (−43 dB) of the LO signal from the IF signal are obtained in the mixer circuit of FIG. 1, compared to the conventional mixer circuit of FIG. 4. The IF signal component at the node 17 leaks a little to the first input terminal 12 as above described. However, the leak level of the IF signal component is negligible to the LO signal, since the input power $P_{IF}$ of the IF signal call be set to be low (−35 dBm).

Thus, a sufficient isolation of the two input signals from each other is realized in the mixer circuit of FIG. 1 without needing the BEFs 71 and 72 of the conventional mixer circuit of FIG. 4, which economizes substantial circuit space about 18 mm$^2$ and input signal loss about 2 dB when the size and the signal loss of a BEF are 9.0 mm$^2$ and 1 dB, respectively.

Figure 5:
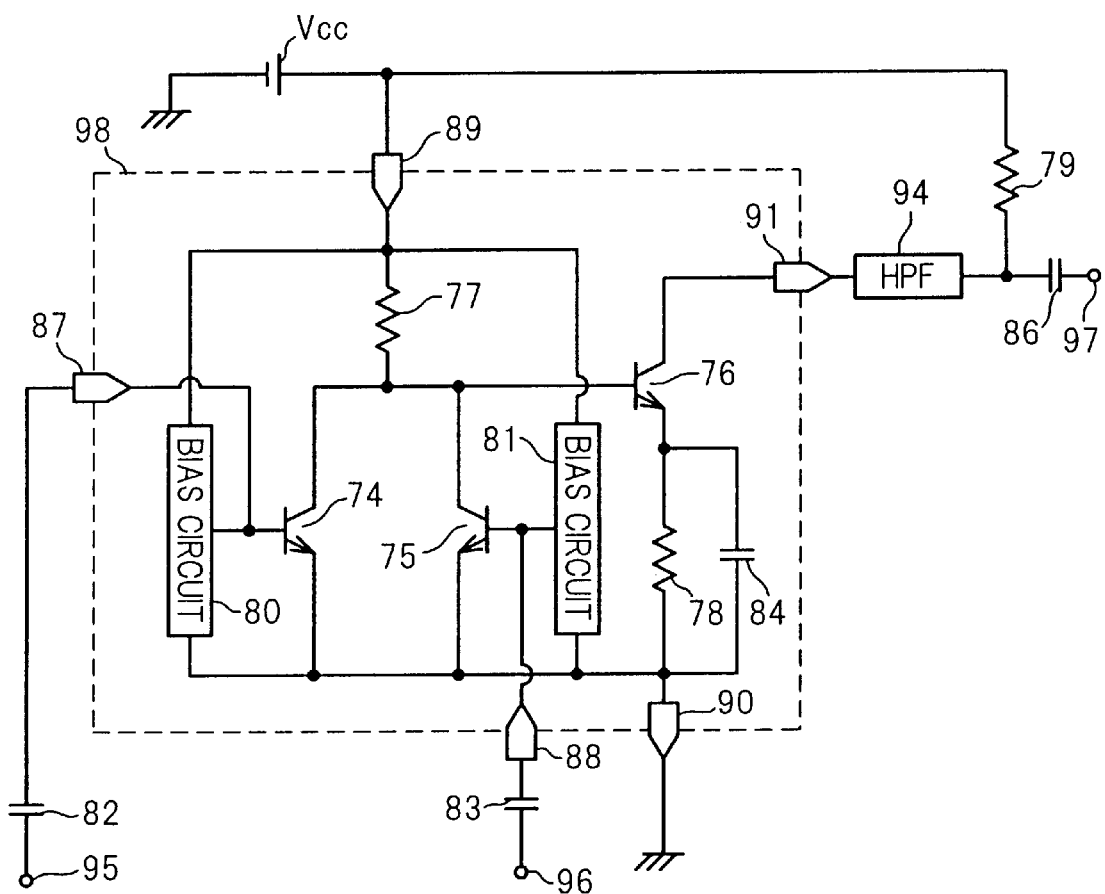
FIG. 5 is a circuit diagram illustrating a mixer circuit according to a prior art.

Furthermore, the isolation of the two input signals is realized with the serial connection of the two transistors Q1 and Q2 in the mixer circuit of FIG. 1, while the two transistors 74 and 75 are used in parallel for the isolation in the prior mixer circuit of FIG. 5. Therefore, collector current for one transistor can be economized in the mixer circuit of FIG. 1 compared to the prior mixer circuit of FIG. 5.

Now, a second embodiment of the invention will be described referring to a circuit diagram of FIG. 3, wherein GaAs FETs (Field Effect Transistors) are used.

Figure 3:
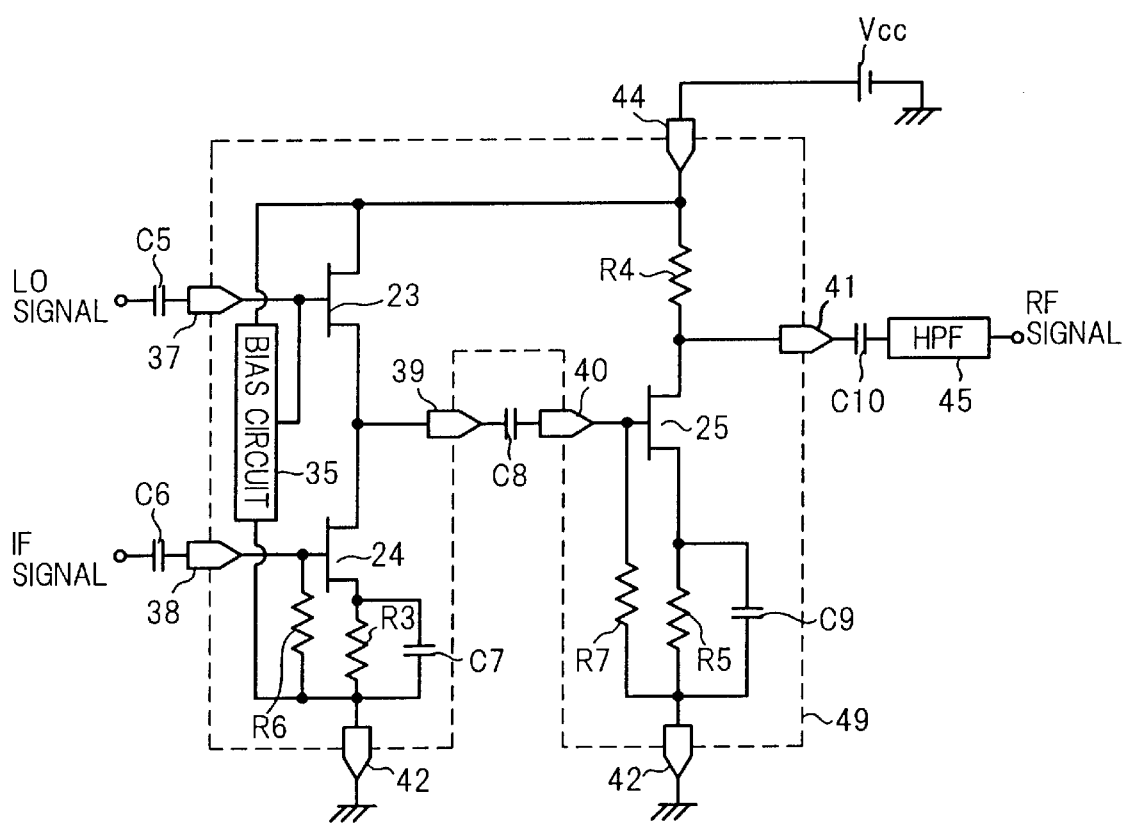
FIG. 3 is a circuit diagram illustrating a mixer circuit according to a second embodiment of the invention.

In FIG. 3, a mixer IC 49 comprises;

a first FET 23, whereof a drain is connected to a power supply terminal 44, a source is connected to an mixed signal output terminal 39 and a gate connected to a first input terminal 37, a bias circuit 35 connected between the power supply terminal 44 and a ground terminal 42 for biasing the gate of the first FET 23, a second FET 24, whereof a drain connected to the mixed signal output terminal 39 and a gate connected to a second input terminal 38, a parallel connection of a first resistor R3 and a first capacitor C7 connected between a source of the second FET 24 and the ground terminal 42, a second resistor R6 connected between the gate of the second FET 24 and the ground terminal 42, a third FET 25, whereof a drain is connected to an output terminal 41 and a gate is connected to an mixed signal input terminal 40, a third resistor R4 connected between the drain of the third FET 25 and the power supply terminal 44, a parallel connection of a fourth resistor R5 and a second capacitor C9 connected between a source of the third FET 25 and the ground terminal 42, and a fifth resistor R7 connected between the gate of the third FET 25 and the ground terminal 42.

The mixed signal output terminal 39 and the mixed signal input terminal 40 is connected through a capacitor C8, which is provided outside the mixer IC 49 for blocking the DC component with sufficiently large capacitance.

When the mixer IC 49 is used as an up-converter, an LO signal and an IF signal are supplied to the first and the second input terminal 37 and 38 through capacitors C5 and C6, respectively, and a power supply voltage Vcc is supplied between the power supply terminal 44 and the ground terminal 42, for obtaining an RF signal from the output terminal 41 through a capacitor C10 and a HPF 45.

The mixer circuit of FIG. 3 operates in a similar way with the mixer circuit of FIG. 1.

The LO signal input to the first input terminal 37 is biased by the bias circuit 35 and supplied to the gate of the first FET 23, and the IF signal input to the second input terminal 38, which is biased around a ground voltage by the second resistor R6, is supplied to the gate of the second FET 24. Hence, a mixed signal having frequency components of the LO signal and the IF signal is obtained at the mixed signal output terminal 39, which is supplied through the capacitor C8 to the gate of the third FET 25 and nonlinearly amplified to be output to the output terminal 41, wherefrom the RF signal component is extracted by the HPF 45.

In the same way, the mixer IC 49 can operates as a dowm-converter for obtaining an IF signal by inputting an RF signal to the second input terminal 38.

Thus, also in the mixer circuit of FIG. 3, a sufficient isolation of the two input signals is realized without needing any BEF with lower power consumption than the prior mixer circuit of FIG. 5.

Here, some preferable examples of the resistances and capacitances of the mixer circuits of FIG. 1 and FIG. 3 are described.

As to the resistors R1 and R4, they are preferably 100 to 200Ω. They work as collector/drain resistors and should be larger than emitter/source resistors and cannot be so large when the power supply voltage Vcc is 3V.

As to the resistors R2, R3 and R5, they are preferably 10 to 100Ω. They work as the emitter/source resistors and the larger is the better for stabilizing the collector/drain current. However, they should be smaller than the collector/drain resistors.

As to the resistors R6 and R7, they are preferably 1 to 30kΩ for biasing the gate potential to the ground voltage.

As to the capacitors C1, C7 and C9, they are preferably 100 to 300 pF. They work for bypassing signal frequencies and the larger is the better. However they should be configured in the IC chips.

As to the capacitors C2 to C6, C8 and C10, they are preferably 1000 to 10000 pF. They are used for transferring signal frequencies without attenuation and may be provided outside the IC chips.

What is claimed is:

1. A mixer circuit comprising:

a first transistor, a collector thereof being connected to a power supply terminal, an emitter thereof connected to a node and a base thereof connected to a first input terminal;

a second transistor, a base thereof being connected to a second input terminal, an emitter thereof connected to a ground terminal and a collector thereof connected to the node;

a first bias circuit for biasing base potential of the first transistor;

a second bias circuit for biasing base potential of the second transistor;

a third transistor, a base thereof being connected to the node and a collector thereof connected to an output terminal;

a first resistor connected between the collector of the third transistor and the power supply terminal, and;

a parallel connection of a second resistor and a capacitor connected between an emitter of the third transistor and the ground terminal.

2. The mixer circuit as recited in claim 1 to be used as all up-converter for obtaining an RF (Radio Frequency) signal through a HPF (High-Pass-Filter) from the output terminal, by mixing an LO (LOcal frequency) signal supplied to the first input terminal through a capacitor and an IF (Intermediate Frequency) signal supplied to the second input terminal through another capacitor; wherein amplitude of the IF signal is set to be comparatively low.

3. The mixer circuit as recited in claim 1 to be used as a down-converter for obtaining an IF signal through a HPF from the output terminal, by mixing an LO signal supplied to the first input terminal through a capacitor and an RF signal supplied to the second input terminal through another capacitor; wherein amplitude of the RF signal is set to be comparatively low.

4. A mixer circuit comprising:

a first FET (Field Effect Transistor), whereof a drain is connected to a power supply terminal, a source is connected to a mixed signal output terminal and a gate connected to a first input terminal;

a bias circuit for biasing the gate of the first FET;

a second FET, whereof a drain connected to the mixed signal output terminal and a gate connected to a second input terminal;

a parallel connection of a first resistor and a first capacitor connected between a source of the second FET and a ground terminal;

a second resistor connected between the gate of the second FET and the ground terminal;

a third FET, whereof a drain is connected to an output terminal and a gate is connected to an mixed signal input terminal which is coupled to the mixed signal output terminal through a third capacitor;

a third resistor connected between the drain of the third FET and the power supply terminal;

a parallel connection of a fourth resistor and a second capacitor connected between a source of the third FET and the ground terminal; and a fifth resistor connected between the gate of the third FET and the ground terminal.

* * * * *